United States Patent
Shin et al.

[11] Patent Number: 5,710,735
[45] Date of Patent: Jan. 20, 1998

[54] EEPROM AND METHOD FOR FABRICATING THE SAME

[75] Inventors: Ki Soo Shin; Soo Han Choi, both of Kyoungki-do, Rep. of Korea

[73] Assignee: Hyundai Electronics Industries Co., Ltd., Kyoungki-do, Rep. of Korea

[21] Appl. No.: 764,245

[22] Filed: Dec. 12, 1996

Related U.S. Application Data

[62] Division of Ser. No. 503,246, Jul. 17, 1995, Pat. No. 5,614,429.

[30] Foreign Application Priority Data

Jul. 18, 1994 [KR] Rep. of Korea ............... 94-17297

[51] Int. Cl.$^6$ ............................................. G11C 16/02
[52] U.S. Cl. .......................... 365/185.26; 365/185.01; 257/319
[58] Field of Search .................. 365/185.26, 185.01; 257/316, 319, 320, 321

[56] References Cited

U.S. PATENT DOCUMENTS

| | | | |
|---|---|---|---|
| 4,988,635 | 1/1991 | Ajika et al. | 437/43 |
| 5,284,784 | 2/1994 | Manley | 257/319 X |
| 5,455,792 | 10/1995 | Yi | 257/319 X |
| 5,494,838 | 2/1996 | Chang et al. | 437/43 |
| 5,498,559 | 3/1996 | Chang | 437/43 |

*Primary Examiner*—Do Hyun Yoo
*Attorney, Agent, or Firm*—Morgan & Finnegan, LLP

[57] ABSTRACT

An EEPROM including a selecting gate which overlaps with one side of a floating gate and a certain part of a source electrode and a control gate which overlaps with the other side of the floating gate and a certain part of a drain electrode, is improved in charge coupling ratio, showing an increase in program efficiency even at low outer voltages. Application of low outer voltages to the EEPROM brings about a decrease in both the breakdown voltage and the junction breakdown voltage of the gate oxide film of peripheral transistors, allowing a shallow junction and a thin gate oxide film process to be possible. A shallow junction can be effected by an ion-implanting process which results in formation of a source electrode and a drain electrode.

4 Claims, 1 Drawing Sheet

EEPROM AND METHOD FOR FABRICATING THE SAME

This is a divisional of application Ser. No. 08/503,246 filed Jul. 17, 1995 now U.S. Pat. No. 5,614,429.

BACKGROUND OF THE INVENTION

1. Field of the Invention

The present invention relates, in general, to an electrically erasable, programmable read only memory (hereinafter referred to as "EEPROM") and, more particularly, to an EEPROM with high charge coupling efficiency and program efficiency even at low outer voltage. Also, the present invention is concerned with a simple method fox fabricating the EEPROM.

2. Description of the Prior Art

Generally, an EEPROM is known as a semiconductor device capable of electrically writing and erasing data. As for its structure, a floating gate on which charges are accumulated is interposed between a control gate and a gate oxide film.

If a high voltage is applied between the control gate and a drain electrode in the forward direction, high energy electrons generated around the drain electrode are injected over a potential barrier of the thin gate oxide film into the floating gate by hot carrier injection. The threshold voltage of transistor varies in accordance with the amount of the injected charges, recording data.

On the other hand, if a high voltage is applied between the control gate and the drain electrode in a backward direction, the electrons injected into the floating gate pass through the tunnel oxide film into the semiconductor substrate, which is called a Fowler-Nordheim tunneling phenomenon, erasing the data recorded in the floating gate.

In such EEPROM, the gate oxide film beneath the floating gate, acting as the tunnel oxide film, is thin enough for the electrons to tunnel while recording and erasing data. In addition, punchthrough voltage and threshold voltage of a transistor should be considered in determining the thickness of the tunnel oxide film.

In order to better understand the background of the present invention a description of conventional techniques will be given below in connection with some drawings.

Referring to FIG. 1, there is shown an example of a conventional EEPROM. As shown in this figure, an oxide film 2 and an island of a floating gate 3 are stacked on a semiconductor substrate 1 in which a drain electrode 4 is formed below the right side of the floating gate 3. And, on the surface of the floating gate 3 and the semiconductor substrate 1 is formed an interlayer insulating film 5 on which a control gate 7 lengthwise extends shielding the floating gate 3. A source electrode 4' is formed in the semiconductor substrate 1 below the left side of the control gate 7 which then serves as a selecting gate between the floating gate 3 and the source electrode 4'.

Such a conventional EEPROM is superior in charge coupling efficiency by virtue of the control gate's shielding the floating gate. However, it is disadvantageous in that the two distinct ion implantation processes should be effected in order to form the drain electrode and the source electrode in respective areas of the semiconductor substrate.

Turning to FIG. 2, there is another example of a conventional EEPROM. Shown is a split gate type EEPROM wherein an oxide film 12 and an island of a floating gate 13 are stacked on a semiconductor substrate 11. An interlayer insulating film 15 is formed on the entire surface of the floating gate 13 and the exposed semiconductor substrate 11. A control gate 17 on the interlayer insulating film extends from the upper surface of the floating gate 13 to a predetermined portion of the semiconductor substrate 11. While a drain electrode 14 is formed below the right side of the floating gate 13, a source electrode 14' is formed below the left side of the control gate 17. It serves as a selecting gate between the floating gate 13 and the source electrode 14'.

A significant disadvantage of the split gate type EEPROM is that one side wall of the floating gate does not overlap with the control gate, so that the charge coupling ratio is lowered, which results in a decrease of program efficiency.

SUMMARY OF THE INVENTION

Accordingly, it is an object of the present invention to overcome the above-mentioned problems encountered in the prior art and to provide an EEPROM with high charge coupling ratio and program efficiency.

It is another object of the present invention to provide a simple method for fabricating an EEPROM which is capable of forming a source electrode and a drain electrode simultaneously while effecting a shallow junction.

In accordance with an aspect of the present invention, there is provided a method for fabricating an EEPROM, comprising the steps of: forming a gate oxide film on a semiconductor substrate; forming a floating gate on the gate oxide film; forming a first interlayer insulating film on the entire surface of the floating gate and the exposed semiconductor substrate; forming a selecting gate on an area of the first interlayer insulating film ranging from a portion of the semiconductor substrate to a portion of the upper surface of the floating gate; implanting impurities into the semiconductor substrate to form a source electrode and a drain electrode by use of the floating gate and the selecting gate serving as a mask, said impurities differing from said semiconductor substrate in type; forming a second interlayer insulating film on the entire surface of the resulting structure; etching a portion of the second interlayer insulating film on the selecting gate to expose a contact hole through which the selecting gate is exposed; and forming a control gate which is in touch with the selecting gate through the contact hole and shields the non-overlapped upper surface of the floating gate.

In accordance with another object of the present invention, there is provided an EEPROM, comprising: a gate oxide film and a floating gate stacked on a semiconductor substrate; a first interlayer insulating film formed on the entire surface of the floating gate and the semiconductor substrate; a selecting gate overlapping with the first interlayer insulating film from the upper surface of the floating gate to a portion of the semiconductor substrate; a drain electrode and a source electrode formed in the semiconductor substrate which overlap with a portion of the floating gate and the selecting gate, respectively; a second interlayer insulating film formed on the entire surface of the resulting structure; a contact hole formed in the second interlayer insulating film, exposing the selecting gate; and a control gate which is in touch with the selecting gate through the contact hole and shields the other non-overlapped surface portion of the floating gate.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

Figure 1:
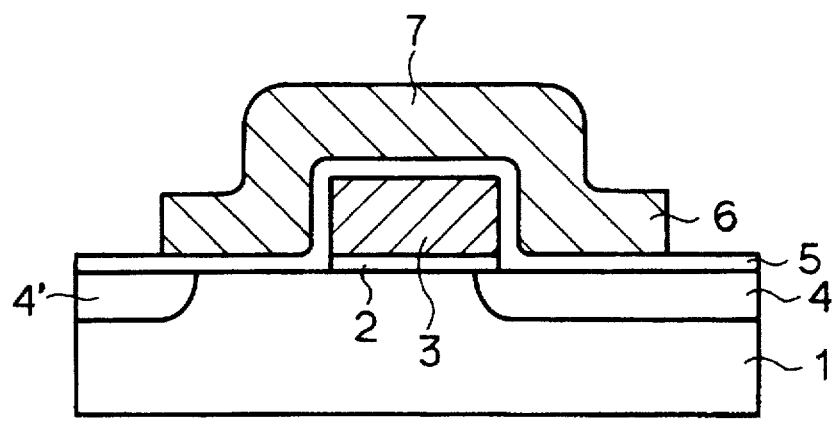
FIG. 1 is a schematic cross sectional view showing an EEPROM structure fabricated according to a conventional method.
Figure 2:
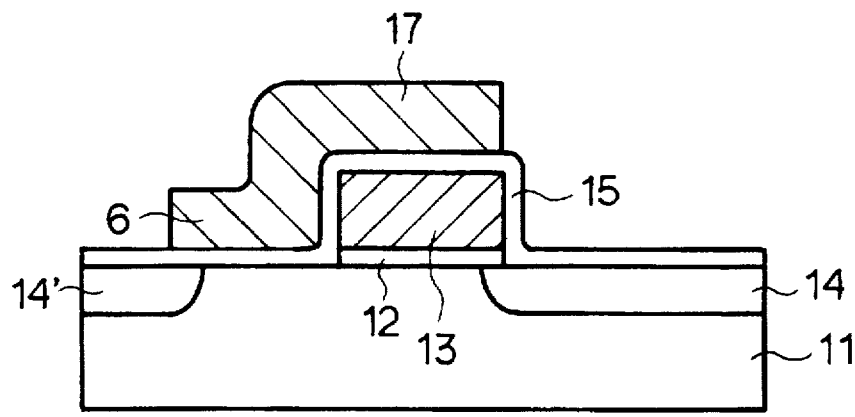
FIG. 2 is a schematic cross sectional view showing an EEPROM structure fabricated according to another conventional method.
Figure 3:
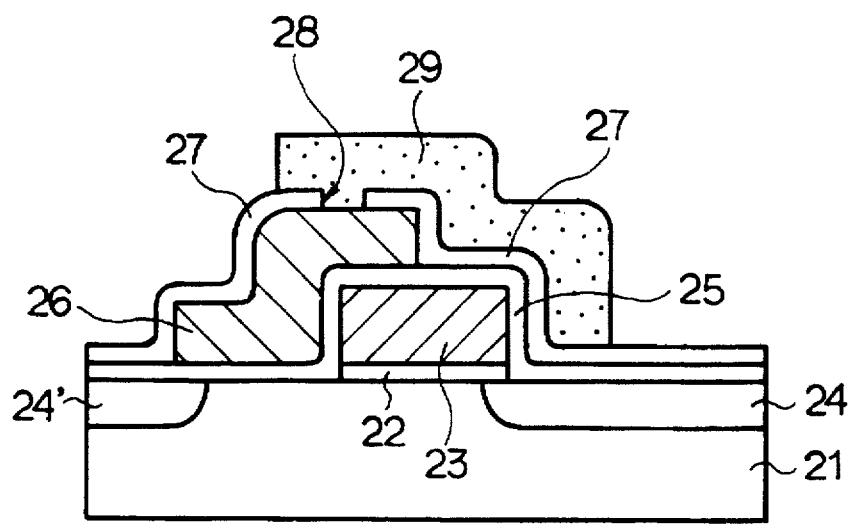
FIG. 3 is a schematic cross sectional view showing an EEPROM structure fabricated according to the present invention.

The application of the preferred embodiments of the present invention is best understood with reference to the accompanying drawings.

with reference to FIG. 3, there is shown an EEPROM according to the present invention.

As shown in this drawing, a gate oxide film 22 and a floating gate 23 is stacked on a semiconductor substrate 21, after which a first interlayer insulating film 25 is formed on the entire surface of the floating gate 23 and the semiconductor substrate 21 exposed. A selecting gate 26 which extends lengthwise is formed in such a way as to overlap with the a left part of the floating gate 23 and an area of the semiconductor substrate 21. The floating gate 23 has such a rectangular shape as to partially overlap with the active region.

At that moment, the gate oxide film 22 beneath the floating gate 23 has a thickness of, for example, 100 Angstrom or thinner enough for electrons to tunnel and thus, serves as a tunnel oxide film. Either a monolayer of an oxide film or a multilayer of oxide-nitride-oxide may be employed for the first interlayer insulating film 25.

Thereafter, using the floating gate 23 and the selecting gate 26 as a mask, impurities which are of opposite type to the semiconductor substrate are implanted into the semiconductor substrate to form a drain electrode 24 and a source electrode 24', followed by formation of a second interlayer insulating film 27 on the entire surface of the resulting structure.

A predetermined area of the second interlayer insulating film 27 is etched to form a contact hole 28 through which a part of the selecting gate 26 is exposed. A control gate 29 which is in touch with the selecting gate 26 through the contact hole 28 is so formed as to shield the right side of the floating gate 23.

As described hereinbefore, the EEPROM according to the present invention comprises a selecting gate which overlaps with one side of a floating gate and a certain part of a source electrode and a control gate which overlaps with the other side of the floating gate and a certain part of a drain electrode. The EEPROM of the present invention is improved in charge coupling ratio, showing an increase in program efficiency even at low outer voltages. In addition, application of low outer voltages to the EEPROM brings about a decrease in both the breakdown voltage and the junction breakdown voltage of the gate oxide film of peripheral transistors, allowing a shallow junction and a thin gate oxide film process to be possible. Further, after forming the selecting gate on the floating gate, a shallow junction can be effected by an ion-implanting process which results in the formation of a source electrode and a drain electrode.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. An EEPROM, comprising:

a gate oxide film and a floating gate stacked on a semiconductor substrate;

a first interlayer insulating film formed on all exposed surfaces of the floating gate and the semiconductor substrate;

a selecting gate overlapping with the first interlayer insulating film from an upper surface of the floating gate to a portion of the semiconductor substrate;

a drain electrode and a source electrode formed in the semiconductor substrate which overlap with a portion of the floating gate and a portion of the selecting gate, respectively;

a second interlayer insulating film formed on all exposed surfaces of the first interlayer insulating film and the selecting gate;

a contact hole formed in the second interlayer insulating film, exposing the selecting gate; and a control gate which is in touch with the selecting gate through the contact hole and shields a surface portion of the floating gate which is not overlapped by the selecting gate.

2. An EEPROM in accordance with claim 1, wherein said floating gate is of island type overlapping with only an active region of the semiconductor substrate.

3. An EEPROM in accordance with claim 1, wherein said selecting gate and said control gate are formed extending in one direction.

4. An EEPROM in accordance with claim 1, wherein said first interlayer insulating film is structured to be either an oxide film monolayer or an oxide-nitride-oxide multilayer.

* * * * *